(12) United States Patent
Chetanneau et al.

(10) Patent No.: US 11,385,264 B2
(45) Date of Patent: Jul. 12, 2022

(54) CURRENT SENSOR WITH FLUX GATE

(71) Applicant: SAFRAN ELECTRONICS & DEFENSE, Paris (FR)

(72) Inventors: Patrice Chetanneau, Paris (FR); François Guillot, Paris (FR)

(73) Assignee: SAFRAN ELECTRONICS & DEFENSE, Paris (FR)

( * ) Notice: Subject to any disclaimer, the term of this patent is extended or adjusted under 35 U.S.C. 154(b) by 0 days.

(21) Appl. No.: 17/252,617

(22) PCT Filed: Jun. 24, 2019

(86) PCT No.: PCT/EP2019/066583
§ 371 (c)(1),
(2) Date: Dec. 15, 2020

(87) PCT Pub. No.: WO2020/002184
PCT Pub. Date: Jan. 2, 2020

(65) Prior Publication Data
US 2021/0255222 A1    Aug. 19, 2021

(30) Foreign Application Priority Data

Jun. 27, 2018   (FR) ..................... 18 55755

(51) Int. Cl.
*G01R 15/18* (2006.01)
*G01R 15/20* (2006.01)
(Continued)

(52) U.S. Cl.
CPC ......... *G01R 15/185* (2013.01); *G01R 15/202* (2013.01); *G01R 15/205* (2013.01);
(Continued)

(58) Field of Classification Search
CPC .. G01R 15/207; G01R 15/202; G01R 15/185; G01R 15/205; G01R 19/0092;
(Continued)

(56) References Cited

U.S. PATENT DOCUMENTS

| 2015/0016006 A1* | 1/2015 | van Vroonhoven .. H01F 13/006 361/149 |
| 2015/0042325 A1* | 2/2015 | Snoeij ..................... G01R 15/20 324/251 |

(Continued)

FOREIGN PATENT DOCUMENTS

FR    3060757 A1    6/2018
WO   WO-2014047644 A2    3/2014

*Primary Examiner* — Raul J Rios Russo
(74) *Attorney, Agent, or Firm* — Muncy, Geissler, Olds & Lowe, P.C.

(57) ABSTRACT

A flux gate current sensor includes a magnetic core, a measurement winding, an excitation circuit arranged to generate a digital excitation signal, an acquisition circuit arranged to acquire an analog measurement voltage from the terminals of the measurement winding and to produce a digital measurement signal, a demagnetization servocontrol circuit arranged to use the digital measurement signal to produce a digital demagnetization signal for compensating magnetic flux produced by the current that is to be measured, a summing circuit arranged to sum the digital excitation signal and the digital demagnetization signal so as to obtain a digital injection signal, and an injection circuit arranged to produce an analog excitation current from the digital injection signal and to inject the analog excitation current into the measurement winding.

7 Claims, 3 Drawing Sheets

(51) Int. Cl.
  *G01R 19/20* (2006.01)
  *G01R 23/20* (2006.01)
  *G01R 33/04* (2006.01)
  *G01R 19/00* (2006.01)
(52) U.S. Cl.
  CPC ....... *G01R 15/207* (2013.01); *G01R 19/0092* (2013.01); *G01R 23/20* (2013.01); *G01R 33/04* (2013.01); *G01R 15/181* (2013.01); *G01R 15/20* (2013.01); *G01R 19/20* (2013.01)
(58) Field of Classification Search
  CPC ...... G01R 15/181; G01R 15/20; G01R 19/20; G01R 23/20; G01R 33/04
  USPC ................................ 324/76.11–76.83, 117 R
  See application file for complete search history.

(56) References Cited

U.S. PATENT DOCUMENTS

| | | | |
|---|---|---|---|
| 2016/0202294 A1* | 7/2016 | Snoeij | G01R 19/0092 324/127 |
| 2017/0219632 A1 | 8/2017 | Teppan | |
| 2019/0317135 A1* | 10/2019 | Guillot | G01R 23/20 |
| 2021/0141002 A1* | 5/2021 | Chetanneau | G01R 19/0092 |

\* cited by examiner

CURRENT SENSOR WITH FLUX GATE

The invention relates to the field of flux gate current sensors.

BACKGROUND OF THE INVENTION

A flux gate current sensor makes use of the property of a magnetic material forming a magnetic core whereby it saturates from a certain level of magnetic excitation. With reference to FIG. 1, for an increasing magnetic field H, the slope of the transfer function between magnetic field H and magnetic flux density B decreases greatly from a so-called "saturation" value of the magnetic core. The saturation value, In FIG. 1, corresponds to the ranges ΔH and ΔB.

With reference to FIGS. 2 and 3, in a conventional flux gate current sensor 1 for measuring a current Im flowing in a conductor, a square wave signal generator 2 applies a square wave excitation voltage Vex to the terminals of an excitation winding 3 wound around a magnetic core 4. The excitation current Iex flowing in the excitation winding 3 is measured by a measurement module 5. A peak detector 6 connected to the measurement module 5 supplies two items of information: the saturation level and the difference between the peak currents of the excitation current Iex. The saturation level serves to servocontrol the amplitude of the excitation voltage Vex. The difference between the peak currents of the excitation current Iex serves to estimate the current Im that is to be measured, and it acts via a voltage-to-current converter to servocontrol the amplitude of a demagnetization current that flows in a demagnetization winding 8 and that serves to compensate the magnetic flux produced in the magnetic core 4 by the current Im that is to be measured.

Flux gate current sensors are preferred in certain applications. This applies in particular to measuring a current flowing in a cut-off member of the solid-state power controller (SSPC) type for user equipment, or else to measuring a current flowing in an energy converter member of the power electronic module (PEM) type connected to a phase of a motor.

OBJECT OF THE INVENTION

An object of the invention is to improve the industrial reproducibility and to reduce the cost of a flux gate current sensor.

SUMMARY OF THE INVENTION

In order to achieve this object, there is provided a flux gate current sensor comprising a magnetic core that extends around a conductor in which there flows a current that is to be measured, a measurement winding, an excitation circuit arranged to generate a digital excitation signal, an acquisition circuit comprising an analog-to-digital converter and arranged to acquire an analog measurement voltage from the terminals of the measurement winding and to produce a digital measurement signal, a demagnetization servocontrol circuit arranged to use the digital measurement signal to produce a digital demagnetization signal for compensating magnetic flux produced by the current that is to be measured, a summing circuit arranged to sum the digital excitation signal and the digital demagnetization signal so as to obtain a digital injection signal, and an injection circuit comprising a digital-to-analog converter and arranged to produce an analog excitation current from the digital injection signal and to inject the analog excitation current into the measurement winding.

The flux gate current sensor of the invention thus has a single measurement winding that serves simultaneously to excite the magnetic core, to demagnetize the magnetic core, and to acquire the analog measurement voltage in order to estimate the current that is to be measured. This simplifies and thus reduces the size, the weight, and the cost of manufacturing the flux gate current sensor of the invention.

Furthermore, a large portion of the processing system of the flux gate current sensor of the invention is digital. Using a processing system that is mainly digital serves to further reduce the cost of manufacturing the flux gate current sensor of the invention and to improve its industrial reproducibility.

The invention can be better understood in the light of the following description of a particular, nonlimiting embodiment of the invention.

BRIEF DESCRIPTION OF THE DRAWINGS

Reference is made to the accompanying drawings, in which.

DETAILED DESCRIPTION OF THE INVENTION

Figure 4:
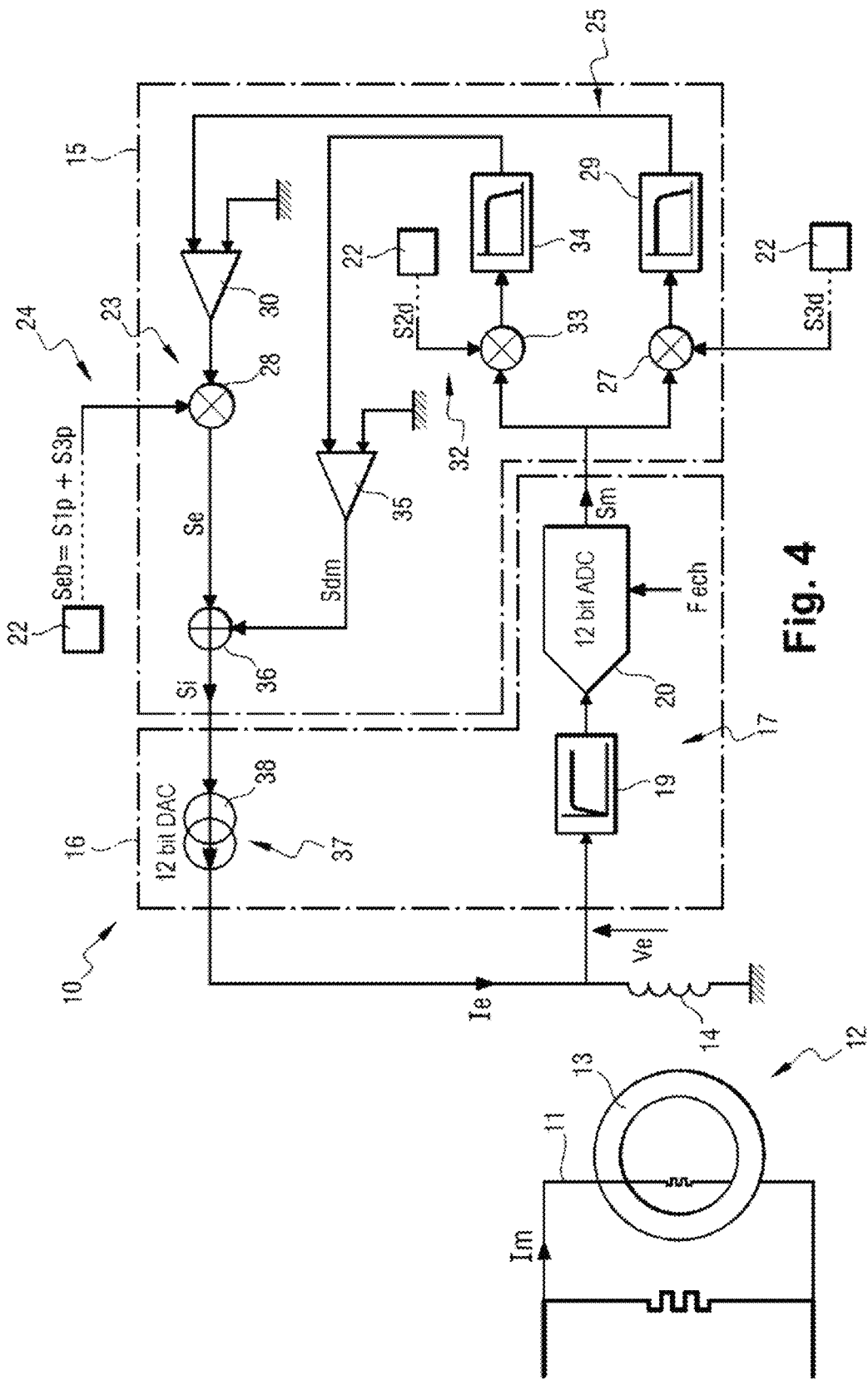
FIG. 4 shows a flux gate current sensor of the invention.

With reference to FIG. 4, a flux gate current sensor 10 of the invention is used in this example to measure a current Im that is to be measured and that flows in a conductor 11.

The flux gate current sensor 10 includes a transformer 12 comprising a magnetic core 13, a primary winding, and a secondary winding. The primary winding is the conductor 11. The magnetic core 13 extends around the conductor 11. The secondary winding is a measurement winding 14 wound around the magnetic core 13.

The flux gate current sensor 10 includes a plurality of electronic components forming a digital portion 15 and an analog portion 16.

The digital portion 15 includes a digital processor component, which is specifically a field programmable gate array (FPGA), but that could be some other component: a microcontroller, a processor, an application-specific integrated circuit (ASIC), etc.

The flux gate current sensor 10 further comprises an acquisition circuit 17. The acquisition circuit 17 forms part of the analog portion 16.

The acquisition circuit 17 is connected to the measurement winding 14.

The acquisition circuit 17 comprises a highpass filter 19 and an analog-to-digital converter (ADC) 20 connected to an output of the highpass filter 19.

In this example, the ADC 20 is a 12-bit converter having its operation clocked at a frequency Fech. In this example Fech=100 megahertz (MHz). The ADC 20 could naturally present characteristics that are different.

The acquisition circuit 17 acquires an analog measurement voltage Ve from the terminals of the measurement winding 14. The measurement voltage Ve is applied as input to the highpass filter 19.

The resulting voltage is applied as input to the ADC 20, which produces a digital measurement signal Sm.

The flux gate current sensor 10 includes a high frequency generator 22. The high frequency generator 22 is incorporated in the FPGA (where the term "incorporated" could be replaced by any of the following terms: programmed, implemented, provided, etc.)

The high frequency generator 22 produces a digital reference signal of frequency f0, a digital reference signal of frequency 2·f0, and a digital reference signal of frequency 3·f0.

In this example, the digital reference signal of frequency f0 is of the form:

$$S1r=\sin(\omega 0 t).$$

In this example, the digital reference signal of frequency 2·f0 is of the form:

$$S2r=\cos(2\cdot\omega 0 t).$$

In this example, the digital reference signal of frequency 3·f0 is of the form:

$$S3r=\sin(3\cdot\omega 0 t).$$

The flux gate current sensor 10 further comprises an excitation circuit 23. The excitation circuit 23 is implemented in the FPGA.

The excitation circuit 23 is connected to the high frequency generator 22.

The excitation circuit 23 comprises a raw excitation circuit 24 and an excitation servocontrol circuit 25.

The raw excitation circuit 24 receives the digital reference signal of frequency f0 and the digital reference signal of frequency 3·f0, and from these signals it produces a partial digital excitation signal of frequency f0 and a partial digital excitation signal of frequency 3·f0.

In this example, the partial digital excitation signal of frequency f0 is of the form:

$$S1p=k1\cdot\sin(\omega 0 t).$$

In this example, the partial digital excitation signal of frequency 3·f0 is of the form:

$$S3p=k2\cdot\sin(3\cdot\omega 0 t).$$

The raw excitation circuit 24 adds together the partial digital excitation signal of frequency f0 and the partial digital excitation signal of frequency 3·f0 in order to generate a raw digital excitation signal. The raw digital excitation signal is of the form:

$$Seb=S1p+S3p=k1\cdot\sin(\omega 0 t)+k2\cdot\sin(3\cdot\omega 0 t).$$

The excitation servocontrol circuit 25 is connected to the high frequency generator 22.

The excitation servocontrol circuit 25 receives the digital reference signal of frequency 3·f0, and from this digital reference signal of reference 3·f0, it produces a digital demodulation signal of frequency 3·f0.

In this example, the digital demodulation signal of frequency 3·f0 is of the form:

$$S3d=k3\cdot\sin(3\cdot\omega 0 t).$$

The excitation servocontrol circuit 25 includes a first multiplier 27, a second multiplier 28, an integrator 29, and a first amplifier 30. The first amplifier 30 is connected to an output of the integrator 29.

The first multiplier 27 multiplies the digital measurement signal Sm by the digital demodulation signal of frequency 3·f0. The resulting signal is applied as input to the integrator 29.

It should be observed that the first multiplier 27 and the integrator 29 act as a first synchronous demodulator.

The first amplifier 30 thus produces a digital error signal. The second multiplier 28 multiplies the raw digital excitation signal Seb by the digital error signal to obtain a digital excitation signal. The digital excitation signal is of the form:

$$Se=k0\cdot(k1\cdot\sin(\omega 0 t)+k2\cdot\sin(3\omega 0 t)).$$

The flux gate current sensor 10 further comprises a demagnetization servocontrol circuit 32. The demagnetization servocontrol circuit 32 is incorporated in the FPGA.

The demagnetization servocontrol circuit 32 is connected to the high frequency generator 22.

The demagnetization servocontrol circuit 32 receives the digital reference signal of frequency 2·f0, and from this digital reference signal of frequency 2·f0, it produces a digital demodulation signal of frequency 2·f0.

In this example, the digital demodulation signal of frequency 2·f0 is of the form:

$$S2d=k4\cdot\cos(2\cdot\omega 0 t).$$

The demagnetization servocontrol circuit 32 includes a third multiplier 33, a lowpass filter 34, and a second amplifier 35. The second amplifier 35 is connected to an output of the lowpass filter 34.

The third multiplier 33 multiplies the digital measurement signal Sm by the digital demodulation signal of frequency 2·f0. The resulting signal is applied as input to the lowpass filter 34. The second amplifier 35 thus produces a signal that is a digital image of the current Im that is to be measured, which signal is also a digital demagnetization signal Sdm. The digital image signal, or digital demagnetization signal Sdm, is of the form:

$$Sdm=k\cdot Im.$$

It should be observed that the third multiplier 33 and the lowpass filter 34 act as a second synchronous demodulator.

The flux gate current sensor 10 further comprises a summing circuit 36. The summing circuit 36 is implemented in the FPGA.

The summing circuit 36 sums the digital excitation signal Se and the digital demagnetization signal Sdm in order to obtain a digital injection signal Si. This gives:

$$Si=k0\cdot(k1\cdot\sin(\omega 0 t)+k2\cdot\sin(3\omega 0 t))+k\cdot Im.$$

The flux gate current sensor 10 further includes an injection circuit 37. The injection circuit 37 forms part of the analog portion 16.

The injection circuit 37 is connected to the summing circuit 36 and to the measurement winding 14.

The injection circuit 37 comprises a digital-to-analog converter (DAC) 38.

In this example, the DAC 38 is a 12-bit converter, and its operation is clocked at the frequency Fech (Fech=100 MHz). The DAC 38 could naturally present characteristics that are different.

The DAC 38 acquires the digital injection signal Si, produces an analog excitation current Ie from the digital injection signal Si, and injects the excitation current Ie into the measurement winding 14.

There follows a description of the operation of the flux gate current sensor 10.

The excitation circuit 23 generates a digital excitation signal Se, which is transformed into an excitation current Ie and injected into the measurement winding 14.

The measurement voltage Ve is acquired and then digitized in order to produce a digital measurement signal Sm.

A signal that is a digital image of the current Im that is to be measured is obtained at the output of the second amplifier 35. This digital image signal is used to estimate the current Im that is to be measured.

The digital image signal is also a digital demagnetization signal Sdm that serves to compensate the magnetic flux produced by the current Im that is to be measured.

By means of the summing circuit 36 and the parallel connection, it is easy to add together the digital demagnetization signal Sdm and the digital excitation signal Se. The excitation current thus serves both to excite the magnetic core 13 and also to demagnetize the magnetic core 13. The demagnetization current is thus incorporated in the excitation current Ie.

Saturation of the magnetic core 13 gives rise to asymmetry in the measurement voltage Ve, said measurement voltage Ve being constituted by the sum of a $\sin(\omega_0 t)$ component of frequency f0, corresponding to the fundamental, and of a $\cos(2\omega_0 t)$ component of frequency 2·f0, corresponding to the second harmonic component.

It should be observed that the amplitudes of the partial digital excitation signal of frequency f0 and of the partial digital excitation signal of frequency 3·f0 are set so as to obtain an excitation current Ie in which the component of frequency 3·f0 (or third harmonic component) is in phase with the component of frequency f0 (or fundamental).

The third harmonic component of the measurement voltage Ve, as obtained after synchronous demodulation using the first synchronous demodulator, is positive. In the event of the magnetic core 13 saturating, the third harmonic component is attenuated more strongly than the fundamental, and, after synchronous demodulation, the third harmonic component becomes negative, since the third harmonic goes into phase opposition with the fundamental.

Figure 1:
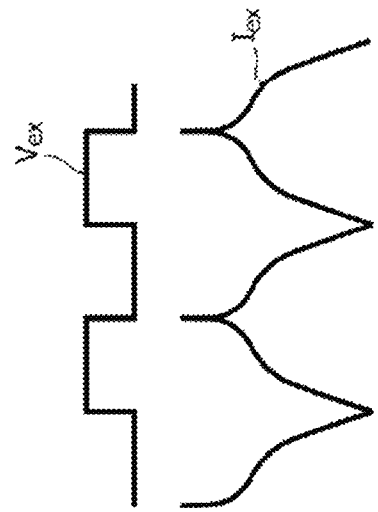
FIG. 1 plots the curve of a transfer function between a magnetic field and a magnetic flux density.
Figure 2:
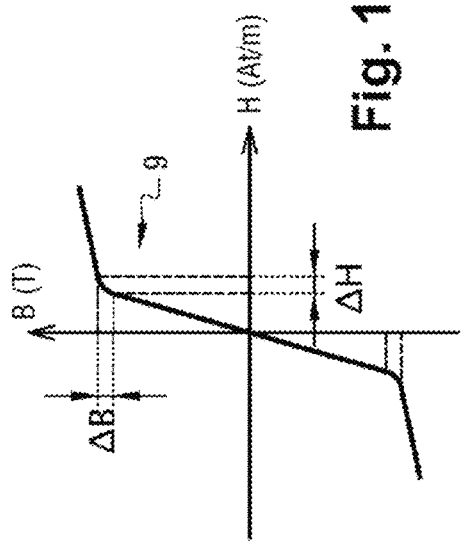
FIG. 2 shows a prior art flux gate current sensor.
Figure 3:
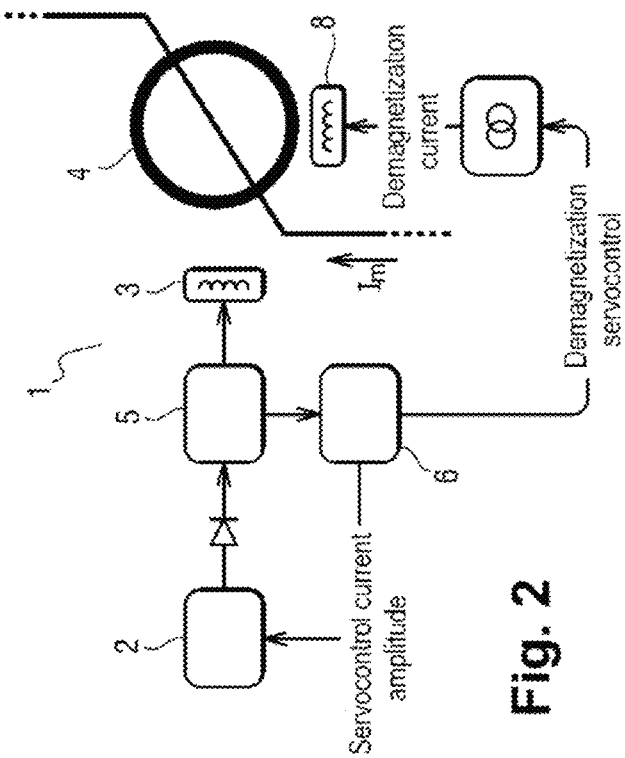
FIG. 3 shows the curve for an excitation voltage and the curve for an excitation current that excite a magnetic core of a prior art flux gate current sensor.

Thus, when the excitation current Ie is such that the magnetic core 13 approaches saturation, the ratio of the amplitudes of the first harmonic component and of the third harmonic component of the measurement voltage Ve varies until the third harmonic component becomes zero, and then until the phase of the third harmonic component is inverted. The operating point corresponding to the third harmonic component of the measurement voltage Ve becoming zero is thus the optimum operating point for the flux gate current sensor 10. This optimum operating point corresponds to the bend 9 in the FIG. 1 curve plotting the transfer function.

A digital error signal is obtained at the output from the first amplifier 30.

The digital error signal serves to servocontrol the excitation current Ie. The servocontrol consists in controlling the excitation current Ie so as to zero the third harmonic component of the measurement voltage Ve. The flux gate current sensor 10 thus operates continuously on the optimum operating point. This serves to obtain maximum gain of the asymmetries that are introduced by the current Im that is to be measured and that are detectable in the measurement voltage Ve. It should be observed that this servocontrol by synchronously demodulating the third harmonic component is relatively insensitive to external electromagnetic disturbances, since all of the signals of frequency other than the frequency 3·f0 generate intermodulation products having components that are filtered by the lowpass filter 34 connected to the output of the third multiplier 33. It may also be observed that this servocontrol does not need to be very fast, since the variations that come from external parameters (temperature, ageing) are relatively slow.

Thus, the measurement winding 14 is used simultaneously to excite the magnetic core 13, to control the excitation, to measure the current Im that is to be measured, and to compensate the magnetic flux produced in the magnetic core 13 by the current Im that is to be measured (demagnetization).

Combining the functions in a single measurement winding 14 serves to simplify the flux gate current sensor 10, to reduce its cost and weight, and to facilitate its manufacture.

It should also be observed that the system for processing measurement is mainly digital: a single FPGA serves to perform a major portion of this processing system.

Digitizing the processing system increases its reliability and its robustness (in particular in terms of temperature), reduces its cost, facilitates its manufacture, and improves its industrial reproducibility.

The improvement in regulating the operating point that results from the demodulation performed by the first synchronous demodulator also serves to obtain better noise immunity.

Furthermore, the use of synchronous demodulators makes it possible to operate at high frequency, thereby permitting a wide bandwidth for the current Im that is to be measured, while conserving very good immunity to external electromagnetic disturbances.

Since measurement is always performed at the optimum operating point corresponding to the saturation bend 9, the sensitivity of the flux gate current sensor 10 is constant in the temperature range. The accuracy of the flux gate current sensor 10 is thus good over a large temperature range.

As mentioned above, the flux gate current sensor 10 measures a current Im that is to be measured and that flows in a conductor 11.

This situation does not give rise to any particular difficulty when the current Im that is to be measured is small (e.g. less than 1 amp (A)).

Nevertheless, when the current that is to be measured is large, a major difficulty arises.

The demagnetization current, which serves to compensate the magnetic flux produced in the magnetic core 13 by the current Im that is to be measured, must also be very large. The magnitude of the demagnetization current needs to be equal to the magnitude of the current that is to be measured divided by the transformation ratio of the transformer 12, which is associated with the characteristics of the primary winding and of the secondary winding.

However, the number of turns of the measurement winding 14 is limited by its size and by the resulting inductance. The greater the inductance, the more the rate of change of the demagnetization current (coming from the digital demagnetization signal Sdm) is limited, and thus the more the bandwidth of the flux gate current sensor 10 is limited. Thus, increasing the number of turns of the secondary winding is not an effective solution.

Increasing the demagnetization current is not an effective solution either. Specifically, that would involve generating a demagnetization voltage that is very large associated with a demagnetization current that is large, which is difficult to achieve using standard components.

It should be observed that this problem is not specific to the flux gate current sensor 10 as described above, but applies to all flux gate current sensors (and in particular to those that include a winding dedicated to demagnetization only).

In order to solve this difficulty, use is made of a current divider bridge so as to reduce the magnitude of the current that is to be measured.

Figure 5:
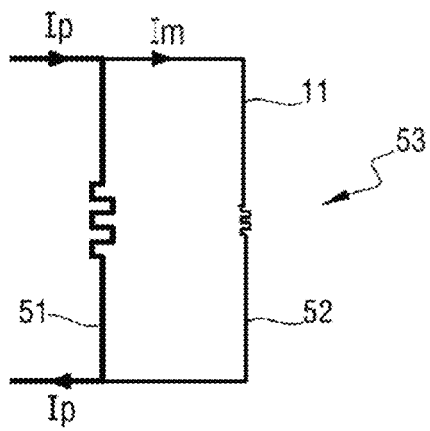
FIG. 5 shows a current divider bridge used for measuring the current that is to be measured.
Figure 6:
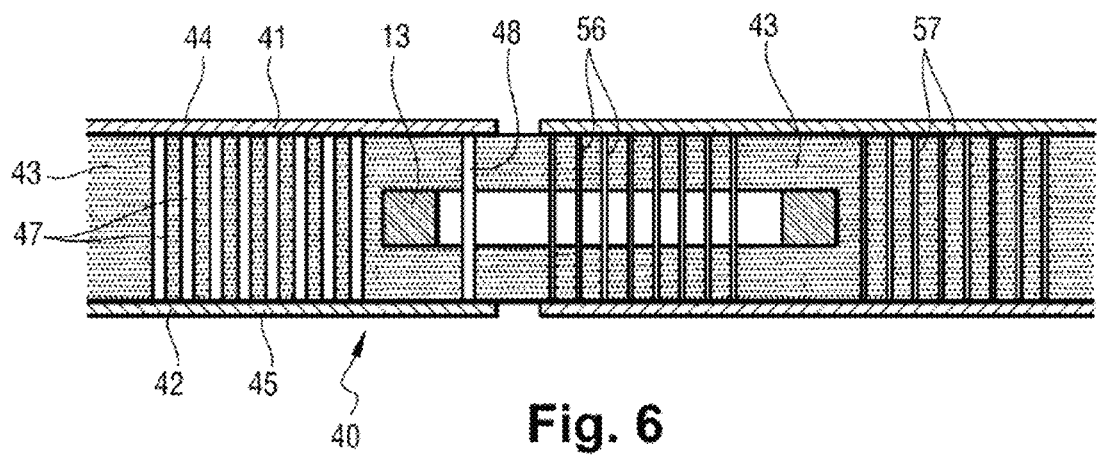
FIG. 6 is a section view of a printed circuit and of a transformer used in the flux gate current sensor of the invention.
Figure 7:
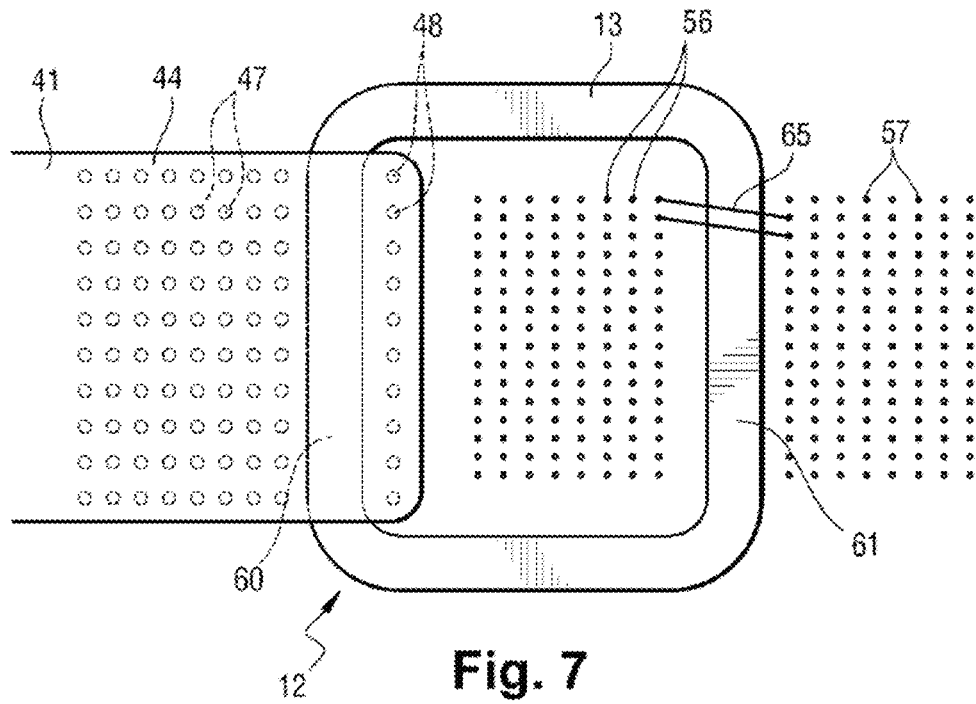
FIG. 7 is a view analogous to the view of FIG. 6, but seen from above.

With reference to FIGS. 5 to 7, the flux gate current sensor 10 comprises a printed circuit 40 having mounted thereon in particular the plurality of electronic components forming the digital portion 15 and the analog portion 16.

In this example, the printed circuit 40 comprises a first conductive layer 41, a second conductive layer 42, and an insulating layer 43. In this example, each of the first conductive layer 41 and the second conductive layer 42 extends over a respective opposite face of the printed circuit 40.

The first conductive layer 41 has a first track 44 and the second conductive layer 42 has a second track 45. The insulating layer 43 thus extends between the first track 44 and the second track 45.

The printed circuit 40 further includes a first through assembly with at least one first plated through hole 47 and a second through assembly with at least one second plated through hole 48. In this example, and specifically, the first through assembly has a plurality of first plated through holes 47 and the second through assembly has a plurality of second plated through holes 48. In this example, the first plated through holes 47 and the second plated through holes 48 all have the same first diameter.

A "plated through hole" may also be referred to as a "via". A "plated through hole" may be made by any type of method. A "plated through hole" may in particular be made conductive by depositing a metal material or any type of conductive material. A "plated through hole" may also be made conductive by inserting a tube or a rivet made of metal or of any type of conductor.

Each first plated through hole 47 and each second plated through hole 48 connects together the first track 44 and the second track 45 by extending through the insulating layer 43.

The first through assembly and the second through assembly form respectively a first branch 51 and a second branch 52 of a current divider bridge 53.

Thus, in this example, the current Im that is to be measured is not in reality a main current Ip having a value that is to be determined, but rather the current Im that is to be measured is obtained by dividing the main current Ip and it is then used for estimating the value of the main current Ip. The main current Ip flows in the first track 44, in the first and second branches 51 and 52 of the current divider bridge 53, and in the second track 45.

In this example, it can thus clearly be seen that the above-mentioned conductor 11 conveying the current that is to be measured is constituted by the second through assembly (or the second branch 52).

In this example, the main current Ip is equal to 10 A.

The number of first plated through holes 47 in the first through assembly is nine times greater than the number of second plated through holes 48 in the second through assembly. The second resistance of the second branch 52 is thus nine times greater than the first resistance of the first branch 51.

The current Im that is to be measured, flowing in the second branch 52 of the current divider bridge 53, is equal to 1 A, while the current flowing in the first branch 51 of the current divider bridge 53 is equal to 9 A.

In this example, advantage is taken of the reproducibility properties of the electrical characteristics of a plurality of same-diameter plated through holes that are adjacent in the same printed circuit 40.

The first resistance of the first branch 51 and the second resistance of the second branch 52 are not accurately known, but because of this reproducibility, their ratio is known very accurately.

The first through assembly and the second through assembly are thus equivalent to two shunt resistors of well-controlled ratio.

The ratio between the current Im that is to be measured and the main current Ip is thus known very accurately. Measuring the current Im that is to be measured enables the main current Ip to be estimated very accurately, while reducing it in order to reduce the demagnetization current that is required.

The current Im that is to be measured is measured by using the above-mentioned transformer 12.

The transformer 12 includes the printed circuit 40, or more precisely, it includes a portion of the printed circuit 40, given that the printed circuit also carries the digital portion 15 and the analog portion 16.

The second through assembly as described above is also referred to herein as the "primary through assembly". The second plated through holes 48 are "primary plated through holes".

The printed circuit 40 also includes a third through assembly comprising at least one third plated through hole 56 extending through the insulating layer 43, and a fourth through assembly comprising at least one fourth plated through hole 57 extending through the insulating layer 43. In this example, and specifically, the third through assembly comprises a plurality of third plated through holes 56 and the fourth through assembly comprises a plurality of fourth plated through holes 57. In this example, the third plated through holes 56 and the fourth plated through holes 57 all have the same second diameter that, for reasons of available space, is smaller than the first diameter of the first plated through holes 47 and of the second plated through holes 48. The number of third plated through holes 56 is equal to the number of fourth plated through holes 57.

The third and fourth through assemblies together form an assembly that is referred to herein as the "secondary through assembly". In the secondary through assembly, the third plated through holes 56 form at least one, and specifically a plurality of "first secondary plated through holes" 56, and the fourth plated through holes 57 form at least one, and specifically a plurality of "second secondary plated through holes" 57.

The transformer 12 also includes the magnetic core 13. The magnetic core 13 extends in the thickness of the printed circuit 40.

The magnetic core 13 is in the shape of a tube having inside and outside sections that are rectangular. It should be observed that the magnetic core 13 could naturally have a shape that is different. The magnetic core 13 includes a primary core portion 60 and a secondary core portion 61.

The primary through assembly extends inside the magnetic core 13, in the proximity of the primary core portion 60.

The primary through assembly thus forms part of a primary winding of the transformer 12, said primary winding having only one turn in this example.

The first secondary plated through holes 56 extend inside the magnetic core 13, in the proximity of the secondary core portion 61. The second secondary plated through holes 57 extend outside the magnetic core 13, in the proximity of the secondary core portion 61.

It can be seen that the first secondary plated through holes 56 and the second secondary plated through holes 57 are connected together by conductive elements 65 (by way of example, but not necessarily, tracks) that extend in the first conductive layer 41 and in the second conductive layer 42. Only two conductive elements 65 are shown in FIG. 7.

The third through assembly thus forms a first portion of the secondary winding of the transformer 12. The fourth through assembly thus forms a second portion of the secondary winding of the transformer. The secondary through assembly thus forms a portion of the secondary winding of the transformer 12.

The secondary winding has a plurality of turns, each turn comprising a first secondary plated through hole 56, a second secondary plated through hole 57, and a conductor element 65.

It can thus be seen that the secondary winding of the transformer 12 is the above-mentioned measurement winding 14.

There follows a description of how the printed circuit 40 and the magnetic core 13 that extends in the thickness of the printed circuit 40 are manufactured.

The printed circuit 40 includes a first prepreg layer and a second prepreg layer (where "prepreg" is short for "pre-impregnated"). The first and second prepreg layers are not polymerized.

The magnetic core 13 comprises a mixture of a magnetic powder and a resin that constitutes a binder for the magnetic powder.

The magnetic powder is made from a crystal structure, specifically yttrium iron garnet ($Y_3Fe_{15}O_{12}$).

The resin is an epoxy resin.

The magnetic core 13 is deposited on the first prepreg layer by silkscreen printing.

Thereafter, the magnetic core 13 is covered by the second prepreg layer.

The printed circuit 40 is then passed through an oven.

The printed circuit 40 is then drilled in order to make the above-described plated through holes.

Alternatively, the magnetic core 13 can be manufactured by laser sintering using an additive manufacturing technology.

The magnetic powder is deposited on a first prepreg layer. Thereafter, a laser beam is used to agglomerate the magnetic powder layer in predefined zones so as to form the magnetic core 13.

The magnetic core 13 is then covered by the second prepreg layer.

Manufacturing the magnetic core 13 by laser sintering appears to be more effective. Specifically, when manufacturing by silkscreen printing, it is observed that in the mixture of magnetic powder and resin there are to be found as many air gaps as there are particles of magnetic powder. These air gaps reduce the performance of the magnetic core 13. With laser sintering, the particles of the magnetic powder are melted, which avoids creating said air gaps.

Naturally, the invention is not limited to the embodiment described, but covers any variant coming within the ambit of the invention as defined by the claims.

It is stated that the flux gate current sensor comprises a digital portion and an analog portion, and that the ADC and the DAC form parts of the analog portion. Naturally, it could be considered that these components are digital components, and even that they are incorporated directly in the FPGA (or in a microcontroller or in some other component), in which case they would form parts of the digital portion.

It is stated above that each of the first conductive layer comprising the first track and the second conductive layer comprising the second track extends over a respective opposite face of the printed circuit. Naturally, the first conductive layer and the second conductive layer could be internal layers of the printed circuit, separated by one or more insulating layers.

Above, each of the through assemblies is described as comprising one or more plated through holes. Above, the plated through holes all pass through a single insulating layer. Naturally, the plated through holes could pass through a plurality of insulating layers, or even through one or more insulating layers and one or more conductive layers. Distinct through assemblies could equally well pass through distinct stacks of layers.

It is stated above that the secondary through assembly comprises at least one first secondary plated through hole and at least one second secondary plated through hole lying on opposite sides of a secondary core portion of the magnetic core. Naturally, it is also possible for the primary through assembly to comprise at least one first primary plated through hole and at least one second primary plated through hole lying on opposite sides of a primary core portion of the magnetic core. It is also possible for both configurations to coexist.

The invention claimed is:

1. A flux gate current sensor comprising:
a magnetic core extending around a conductor in which there flows a current that is to be measured;
a measurement winding;
an excitation circuit arranged to generate a digital excitation signal;
an acquisition circuit comprising an analog-to-digital converter and arranged to acquire an analog measurement voltage from terminals of the measurement winding and to produce a digital measurement signal (Sm);
a demagnetization servocontrol circuit arranged to use the digital measurement signal to produce a digital demagnetization signal for compensating magnetic flux produced by the current that is to be measured;
a summing circuit arranged to sum the digital excitation signal and the digital demagnetization signal so as to obtain a digital injection signal; and
an injection circuit comprising a digital-to-analog converter and arranged to produce an analog excitation current from the digital injection signal and to inject the analog excitation current into the measurement winding.

2. The flux gate current sensor according to claim 1, wherein the digital excitation signal is obtained from a digital reference signal of frequency f0 and from a digital reference signal of frequency 3·f0.

3. The flux gate current sensor according to claim 2, wherein the excitation circuit includes an excitation servocontrol circuit that is arranged to servocontrol the digital excitation signal in such a manner as to zero a component of frequency 3·f0 of the analog measurement voltage.

4. The flux gate current sensor according to claim 3, wherein the excitation servocontrol circuit includes a first multiplier arranged to multiply the digital measurement signal by a digital demodulation signal of frequency 3·f0.

5. The flux gate current sensor according to claim 4, wherein the excitation servocontrol circuit further includes an integrator, a first amplifier connected to an output of the integrator and arranged to produce a digital error signal, and a second multiplier that multiplies a raw digital excitation signal by the digital error signal in order to obtain the digital excitation signal.

6. The flux gate current sensor according to claim 1, wherein the demagnetization servocontrol circuit includes a third multiplier arranged to multiply the digital measurement signal by a digital demodulation signal of frequency $2 \cdot f0$.

7. The flux gate current sensor according to claim 6, wherein the demagnetization servocontrol circuit further includes a lowpass filter, and a second amplifier connected to an output of the lowpass filter and arranged to produce the digital demagnetization signal.

* * * * *